United States Patent [19]

Hinn

[11] 4,082,996
[45] Apr. 4, 1978

[54] VIDEO AMPLIFIER INCLUDING AN A-C COUPLED VOLTAGE FOLLOWER OUTPUT STAGE

[75] Inventor: Werner Hinn, Zollikerberg, Switzerland

[73] Assignee: RCA Corporation, New York, N.Y.

[21] Appl. No.: 727,044

[22] Filed: Sep. 27, 1976

[51] Int. Cl.² .................... H04N 5/68; H04N 9/18
[52] U.S. Cl. .................... 358/242; 358/184; 358/65
[58] Field of Search ............ 358/21, 40, 39, 64, 358/65, 34, 184, 172, 242; 330/32

[56] References Cited

U.S. PATENT DOCUMENTS

| | | | |
|---|---|---|---|
| 2,819,334 | 1/1958 | Squires | 358/21 |
| 3,803,503 | 4/1974 | Greutman | 330/32 |

Primary Examiner—John C. Martin
Attorney, Agent, or Firm—Eugene M. Whitacre; William H. Meagher; Kenneth R. Schaefer

[57] ABSTRACT

A video amplifier suitable for providing amplified image-representative signals to an image reproducing device having a capacitive input impedance component comprises a first wideband amplifier stage which provides video signal voltage gain substantially greater than unity.

A second wideband amplifier stage provides approximately unity video signal voltage gain and includes at least one amplifying device having input, output and common terminals. An output load circuit comprising at least first and second resistors is coupled in series relation between the output and common terminals through the power supply. Direct coupling means are provided for supplying amplified video signals from the output terminal to the image reproducing device. Amplified signals are capacitively coupled from the first stage to the input terminal of the second stage.

A further capacitor is coupled from the input terminal of the second stage to a junction between the first and second resistors of the output load so as to couple video signal excursions of a polarity tending to reduce conduction of the amplifying device to the output terminal and the load.

8 Claims, 1 Drawing Figure

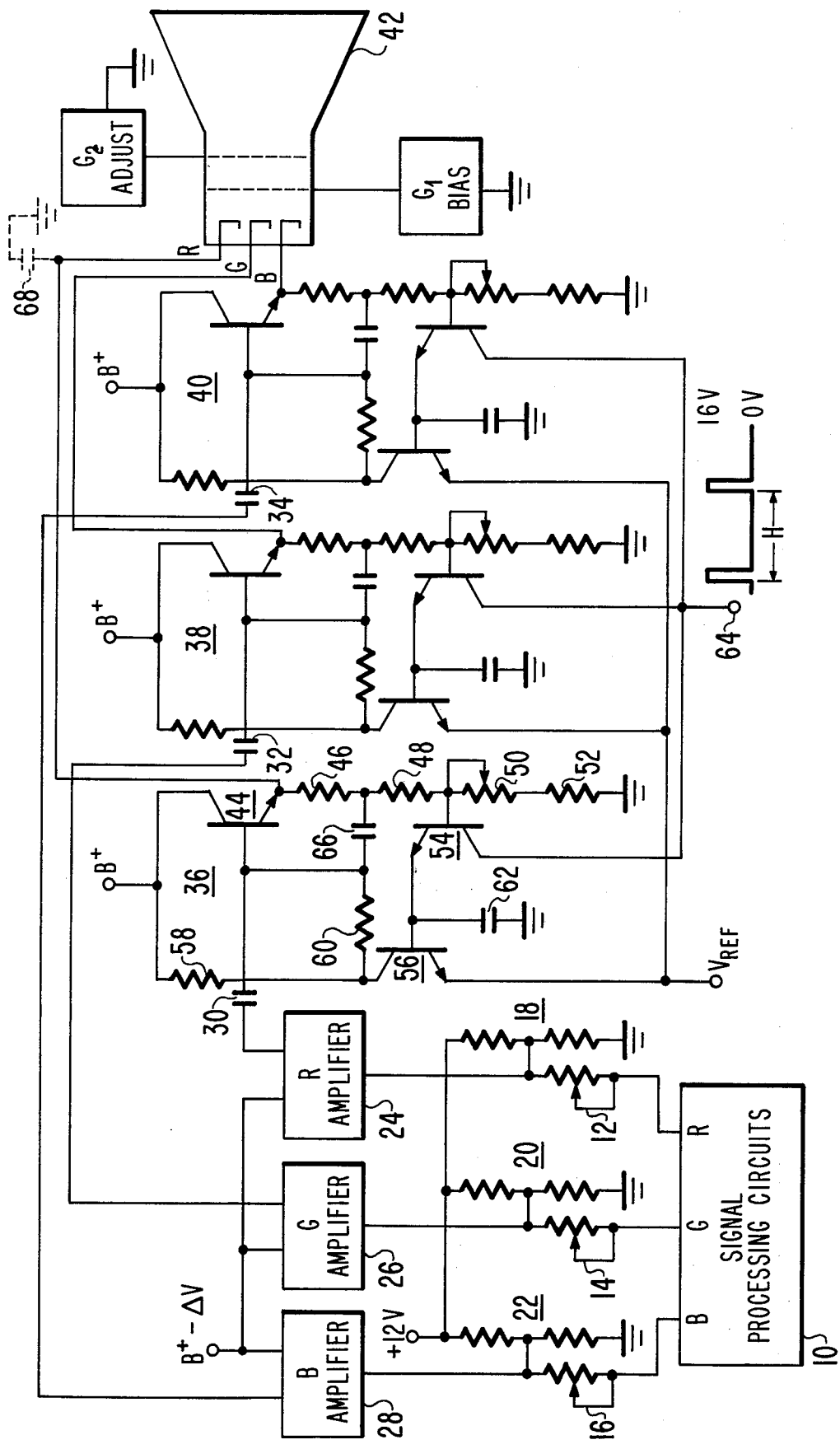

VIDEO AMPLIFIER INCLUDING AN A-C COUPLED VOLTAGE FOLLOWER OUTPUT STAGE

This invention relates to video amplifier circuits and, in particular, to circuits of this type which exhibit stable operating characteristics and are suitable for driving a color picture tube which has a relatively wide cutoff (black level) tolerance range.

Several conflicting requirements, including wide bandwidth, a relatively high direct operating supply voltage and low quiescent power dissipation must be met in designing semiconductor video amplifiers for driving modern color picture tubes. Specifically, color picture tubes such as the unitized PI (precision in-line) gun type frequently require that associated video amplifiers have a relatively wide adjustment range for the direct component of output voltage in order to compensate for a relatively wide tolerance of beam current cutoff voltage of the several guns of the picture tube. In a typical PI tube, an adjustment range of fifty to sixty volts may be required for the beam cutoff voltage while a signal voltage swing of the order of 110 to 130 volts above the cutoff level (black to white) may be necessary. Additional supply voltage variations and practical limitations of the amplifier and picture tube operating characteristics require that the direct supply voltage (B+) for the video output amplifiers be of the order of 200 volts.

Recently, low cost, wide bandwidth, relatively low power video amplifier transistors have been made available which are designed to operate without the use of heat sinks (thereby reducing output capacitance and improving frequency response). It is desirable from a cost and performance standpoint to employ such devices in video output stages. However, a supply voltage of the magnitude described above could either result in a level of power consumption which would exceed the operating limits of such devices or could adversely affect the frequency response of the amplifiers.

The present invention permits one to utilize such low power, low cost, high bandwidth transistors in a system where the direct supply voltage required for the video output stage is greater than a normal supply voltage for such transistors. These conditions may also be encountered where video amplifiers are constructed in monolithic integrated circuit form.

Alternatively, a video amplifier preceding the output stage may be operated at lower supply voltages and hence lower power dissipation when the present invention is employed.

In accordance with the present invention, a video amplifier circuit suitable for driving an image reproducing device comprises a first wideband amplifier stage for providing a video signal voltage gain substantially greater than unity. The apparatus further comprises a second wideband amplifier stage for providing approximately unity video signal voltage gain, the second stage comprising at least one amplifying device having input, output and common terminals. An output load circuit comprising at least first and second resistors is coupled in series relation between the output and common terminals. Means are provided for coupling amplified output signals from the output terminal to the image reproducing device. A first capacitor is provided for coupling amplified signals from the first stage to the input terminal of the second stage.

A second capacitor is coupled from the input terminal of the second stage to a junction between the first and second resistors of the load circuit for coupling video signal excursions of a polarity tending to reduce conduction of the amplifying device to the output terminal.

In the accompanying drawing, a portion of a color television receiver is shown in schematic diagram form including three video amplifier arrangements constructed in accordance with the present invention.

Referring to the drawing, low level television signal processing circuits 10, which may be of a conventional form, provide red (R), green (G) and blue (B) image-representative signals via respective adjustable drive control resistors 12, 14, 16 and associated biasing networks 18, 20, 22 to a red (R) video signal amplifier 24, a green (G) video signal amplifier 26 and a blue (B) video signal amplifier 28, respectively. Each of the amplifiers 24, 26, 28 may employ, for example, wide bandwidth, low power dissipation devices such as the BF422, BF423 complementary type transistors in a Class B arrangement.

Amplified red, green and blue image-representative signals are coupled from amplifiers 24, 26 and 28 via respective capacitors 30, 32 and 34 to video driver or output stages 36, 38, 40 which are constructed in accordance with the present invention.

Red, green and blue image-representative signals having controllable direct voltage levels (as will appear below) are coupled from amplifiers 36, 38, 40 to respective cathodes of an image reproducing cathode ray tube 42. The illustrated cathode ray tube 42 is of the PI type and therefore includes, for all three guns, a common first control grid ($G_1$) bias source and a common second control grid ($G_2$) adjustable bias source.

The output stages 36, 38, 40 are substantially identical and therefore only the red signal amplifier 36 will be described in detail. Output stage 36 comprises a transistor 44 arranged in a voltage follower (common collector) configuration with input signals coupled via capacitor 30 to a base electrode and output signals direct current coupled from the emitter electrode of transistor 44 to the red (R) signal cathode of cathode ray tube 42. The emitter circuit of transistor 44 includes a series combination of resistors 46 and 48, a variable D.C. level adjusting resistor 50 and a resistor 52 coupled to a reference potential (ground). A keyed clamping circuit comprising cascaded transistors 54, 56 a collector load resistor 58, a coupling resistor 60 and a filter capacitor 62 is arranged to compare a fraction of the output voltage (at the junction of resistor 48 and D.C. level adjusting resistor 50) with a direct reference voltage ($V_{REF}$) during each line blanking interval. The collector of transistor 56 is coupled via resistor 60 to the junction of coupling capacitor 30 and the base of output transistor 44 to maintain a desired direct voltage level at the base of transistor 44 and thereby set the direct component of output voltage coupled to the cathode of cathode ray device 42. Keying pulses which occur at the line scanning rate (period of 1H) are supplied to a terminal 64 (the collector of transistor 54 and the collector of similar devices in output stage 38, 40). The keying pulses typically are derived from an associated line deflection system (not shown) and are coincident in time with the blanking interval of each line scanning period. Appropriate voltage levels are illustrated on the waveform adjacent terminal 64.

In accordance with one aspect of the present invention, a capacitor 66 is coupled between the base of voltage follower transistor 44 and a tap on the emitter load resistance (i.e., between resistors 46 and 48 in the FIGURE). As will appear below, capacitor 66 allows the load capacitance 68 associated with the cathode of image reproducer 42 to discharge via resistor 46, capacitor 30 and the preceding amplifier stage 24 to improve the response of the voltage follower transistor 44 to negative-going output signal voltage changes.

As is shown in the drawing, the collector of follower transistor 44 is coupled to an operating voltage supply (B+) while the preceding amplifier 24 is coupled to a lower operating voltage supply (B+ − $\Delta V$). Typical values for such supplies are +190 volts and +160 volts, respectively.

In the operation of the illustrated arrangement, the amplifier 24 provides red image-representative output signals having the peak-to-peak voltage swing (e.g., 130 volts) required for driving cathode ray tube 42. These signals are developed with respect to the supply voltage of amplifier 24 (e.g., +160 volts) which, in the case where cathode ray tube 42 is of the PI type, is insufficient to provide the required range of cutoff adjustment. The signals are A.C. coupled via capacitor 30 to the base of voltage follower transistor 44. For positive-going output voltage signal swings, transistor 44 supplies the current required to charge the load capacitor 68 (e.g., approximately 12 picofarads) which is associated with the red cathode electrode of the tube 42. Transistor 44 serves to reduce the effective cathode capacitance seen by the preceding amplifier 24 by a factor equal to the current gain ($h_{fe}$) of transistor 44 which may be of the order of 50. The transistor 44 itself may be of the type BF392 which exhibits a capacitance of the order of less than 2 picofarads. The overall effect of interposing output stage 36 between amplifier 24 and cathode ray tube 42 is to lower the rise time of signals supplied to cathode ray tube 42.

With regard to negative-going output signal transients, a simple voltage follower normally is arranged to be driven towards cutoff and the discharge of the capacitive output load 68 occurs through the emitter resistor. The effective emitter resistor of follower 44 is the series combination of resistors 46, 48, 50, 52. The total of these resistors may be as high as 20,000 ohms in order to keep power consumption of this stage relatively low. This relatively high value of effective emitter resistance, however, would significantly reduce the ability of a conventional voltage follower to reproduce large negative-going output signal transients. That is, the cathode capacitance 68 of tube 42 could only be discharged with a relatively long time constant via such an emitter resistor. Signal fall times could thus be substantially greater than signal rise times. In the illustrated configuration, capacitor 66 allows the load (cathode) capacitance 68 to discharge via relatively small resistor 46 (e.g., 270 ohms), large capacitor 30 (e.g., 1 microfarad) and the output impedance of preceding amplifier stage 24 fast enough during negative-going transients to obtain substantially equal rise and fall times.

The direct component of the output voltage at the emitter of transistor 44 is set by means of the clamping circuit comprising transistors 54, 56 and associated components. The clamping circuit is keyed on during each line blanking interval and compares that fraction of the direct output voltage developed across resistors 50, 52 with a reference voltage ($V_{REF}$). Transistors 54 and 56 conduct in response to the difference between such voltages to change the charge on coupling capacitor 30. In this way, the direct voltage level of the video signal produced at the emitter of transistor 44 is "restored" during each line blanking interval to a desired level. This level is adjustable by means of resistor 50 during "set-up" of the receiver to correspond to an appropriate black level. The black level voltage may be varied over a range of the order of 50 to 60 volts as is required for PI cathode ray tubes. It should also be noted that the signal swing provided at the output of unity voltage gain transistor 44 will be substantially equal to that provided by the preceding amplifier 24 but will be developed with respect to the appropriate adjustable black level voltage independent of the direct voltage level at the output of preceding amplifier 24. Furthermore, any temperature drift in the preceding amplifier 24 will have no effect on the direct voltage at the output of transistor 44. The amplifier stages 24, 26, 28 all may be operated with substantially equal bias conditions selected to provide a desired linearity with a minimum supply voltage (B+ − $\Delta V$). The amplifiers 24, 26, 28 may thereby be arranged to provide substantially equal rise times so as to avoid differential rise time errors in the three signal channels which would result in an image having an appearance similar to that caused by convergence errors.

Any temperature drift associated with transistor 44 itself will have negligible effect on its direct output voltage since transistor 44 provides only unity voltage gain. Furthermore, temperature drift attributable to transistors 54 and 56 may be expected to be relatively minor and also to be accompanied by like drifts in the clamp circuits associated with amplifiers 38 and 40. Substantially no differential drift and therefore no resultant color shift may be expected from temperature drift of the clamp circuits. It is also possible, if desired, to compensate for any common drift in the clamp circuits by providing an opposite drift in the reference voltage ($V_{REF}$).

While the invention has been described in terms of a preferred embodiment, various modifications may be made within the scope of the invention. Component values for one typical circuit configuration are listed below.

| | |
|---|---|
| Capacitors 30, 32, 34 | 1 microfarad |
| Resistor 46 | 270 ohms |
| Resistor 48 | 18,000 ohms |
| Resistor 50 | 1,000 ohms (adjustable) |
| Resistor 52 | 1,000 ohms |
| Resistor 58 | 47,000 ohms |
| Resistor 60 | 47,000 ohms |
| Capacitor 62 | 100 microfarads |
| Capacitor 66 | 2.2 microfarads |
| Reference Voltage ($V_{REF}$) | +6.8 volts |
| B+ | +190 volts |
| B+ − $\Delta V$ | +160 volts |

What is claimed is:

1. Video amplifier apparatus suitable for providing amplified image-representative signals to an image reproducing device having a capacitive input impedance component, the apparatus comprising:
 a first wideband amplifier stage for providing a video signal voltage gain greater than unity; and
 a second wideband amplifier stage for providing approximately unity video signal voltage gain, said second stage comprising at least one amplifying device having input, output and common terminals, an output load circuit comprising at least first and second resistors coupled in series relation between said output and common terminals, means for coupling amplified signals from said output terminal to said image reproducing device, a first capacitor for coupling amplified signals from said first stage to said input terminal of said second stage, and a second capacitor coupled from said input terminal to a junction between said first and second resistors for coupling video signal excursions of a polarity tending to reduce conduction of said amplifying device to said output terminal.

2. Video amplifier apparatus in accordance with claim 1, wherein:
said first resistor is of substantially lower resistance value than said second resistor.

3. Video amplifier apparatus in accordance with claim 2, wherein:
said second capacitor exhibits a sufficiently low impedance at signal frequencies corresponding to image edge transitions to produce substantially equal signal rise and fall times at said output terminal.

4. Video amplifier apparatus in accordance with claim 3, wherein:
the capacitance of said first capacitor is of the same order of magnitude as the capacitance of said second capacitor.

5. Video amplifier apparatus in accordance with claim 3, wherein:
said first wideband amplifier stage includes means for providing a first direct operating voltage; and
said second wideband amplifier stage includes means for providing a second direct operating voltage greater than said first.

6. Video amplifier apparatus in accordance with claim 5, wherein:
said output load circuit comprises at least one adjustable resistance element for varying direct voltage at said output terminal.

7. Video amplifier apparatus in accordance with claim 6, wherein:
said second wideband amplifier stage further comprises keyed clamping means coupled to said first capacitor for periodically restoring a direct voltage component in said image-representative signals coupled to said second stage.

8. Video amplifier apparatus in accordance with claim 7, wherein:
said adjustable resistance element is coupled to said clamping means for varying said direct voltage component and thereby varying black level of images produced at said image reproducing device.

* * * * *